United States Patent
You

(10) Patent No.: US 10,504,812 B1
(45) Date of Patent: Dec. 10, 2019

(54) HEATING-COOLING MODULE

(71) Applicant: Chicony Electronics Co., Ltd., New Taipei (TW)

(72) Inventor: Jih-Jian You, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 0 days.

(21) Appl. No.: 16/226,675

(22) Filed: Dec. 20, 2018

(30) Foreign Application Priority Data

Sep. 10, 2018 (TW) .............................. 107131756 A

(51) Int. Cl.
*H01L 23/34* (2006.01)
*H05K 7/20* (2006.01)
*H05K 1/02* (2006.01)
*H01L 23/36* (2006.01)

(52) U.S. Cl.
CPC ....... *H01L 23/345* (2013.01); *H05K 7/20463* (2013.01); *H05K 7/20509* (2013.01); *H01L 23/36* (2013.01); *H05K 1/0203* (2013.01); *H05K 7/2039* (2013.01)

(58) Field of Classification Search
CPC .... H05K 7/2039–20518; H05K 1/0201–0203; H01L 23/40–4093; H01L 23/36; H01L 23/345
USPC ........................ 361/704–723; 165/80.1–80.3; 257/712–713, 718–719, 721–722
See application file for complete search history.

(56) References Cited

U.S. PATENT DOCUMENTS

| | | | | | |
|---|---|---|---|---|---|
| 5,992,511 | A | * | 11/1999 | Kodaira | ................ H01L 23/467 165/185 |
| 7,228,894 | B2 | * | 6/2007 | Moore | ................... H01L 23/36 165/185 |
| 7,327,029 | B2 | * | 2/2008 | Archer, III | ......... H01L 21/4871 257/719 |
| 8,611,090 | B2 | * | 12/2013 | Sinha | .................... H01L 21/563 361/708 |
| 9,775,229 | B1 | * | 9/2017 | Haley | ................. H05K 1/0203 |
| 2015/0216084 | A1 | * | 7/2015 | Huang | ................ H01L 23/3677 361/719 |

FOREIGN PATENT DOCUMENTS

TW 201828422 A 8/2018

* cited by examiner

*Primary Examiner* — Zachary Pape
(74) *Attorney, Agent, or Firm* — CKC & Partners Co., LLC

(57) ABSTRACT

A heating-cooling module is disposed on an electronic component and includes a heat-dissipation element, a first thermal conductive layer, a heater, and a second thermal conductive layer. The heat-dissipation element is arranged over the electronic component. The first thermal conductive layer is arranged between the electronic component and the heat-dissipation element. The heater is arranged over the electronic component, in which the heater and the heat-dissipation element are located above the same side of the electronic component, and the heater and the heat-dissipation element are separated from each other. The second thermal conductive layer is arranged between the electronic component and the heater and is separated from the first thermal conductive layer.

13 Claims, 6 Drawing Sheets

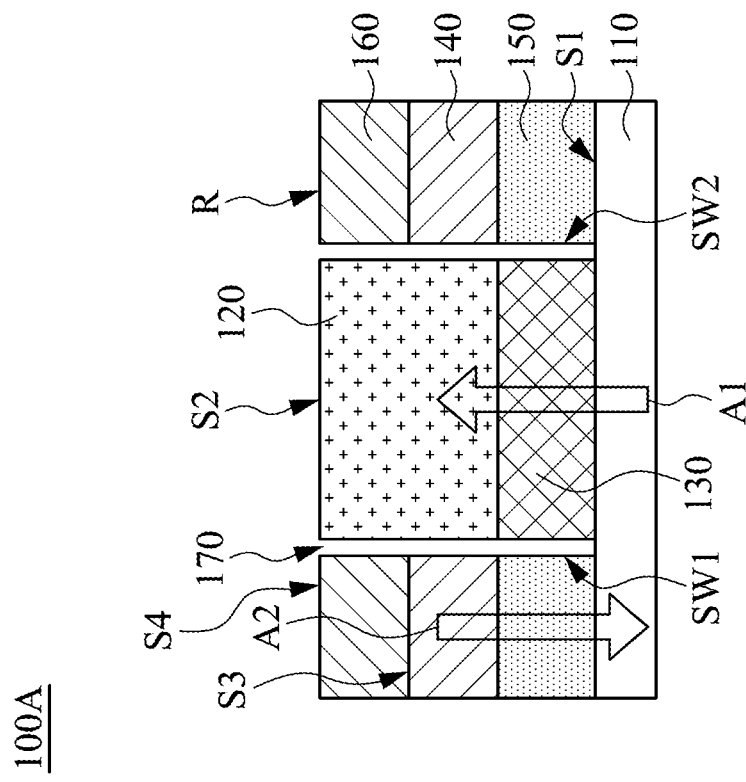
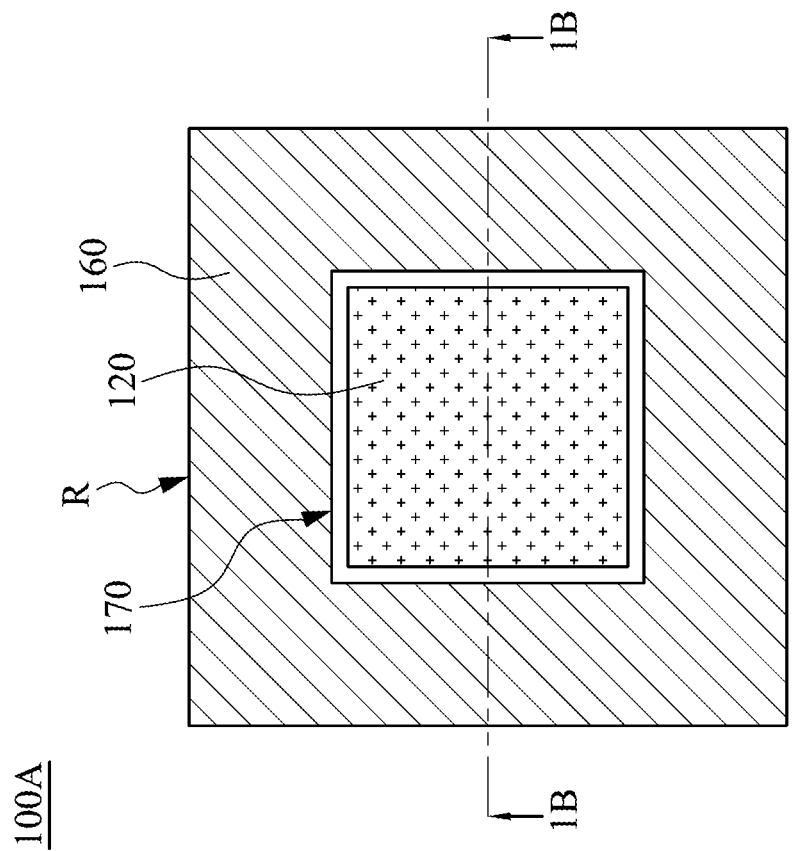
Fig. 1B
Fig. 1A

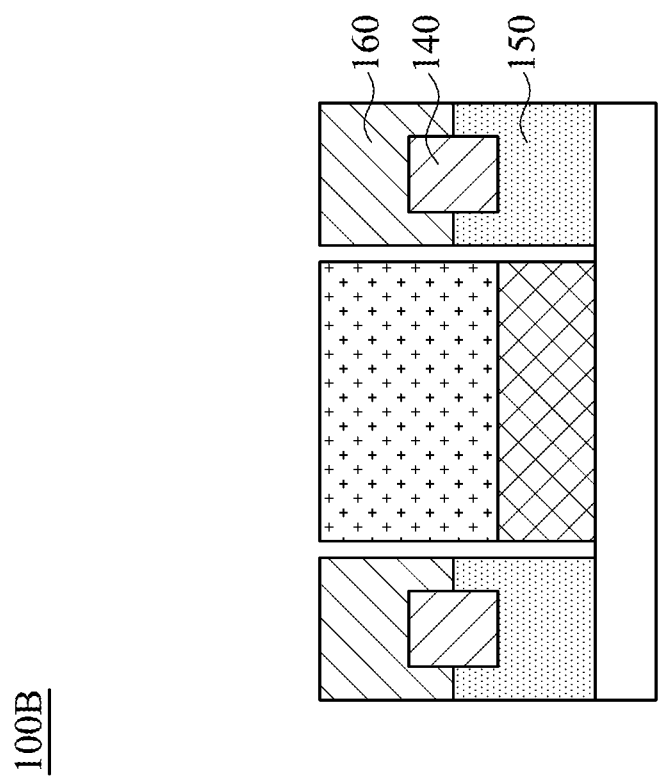
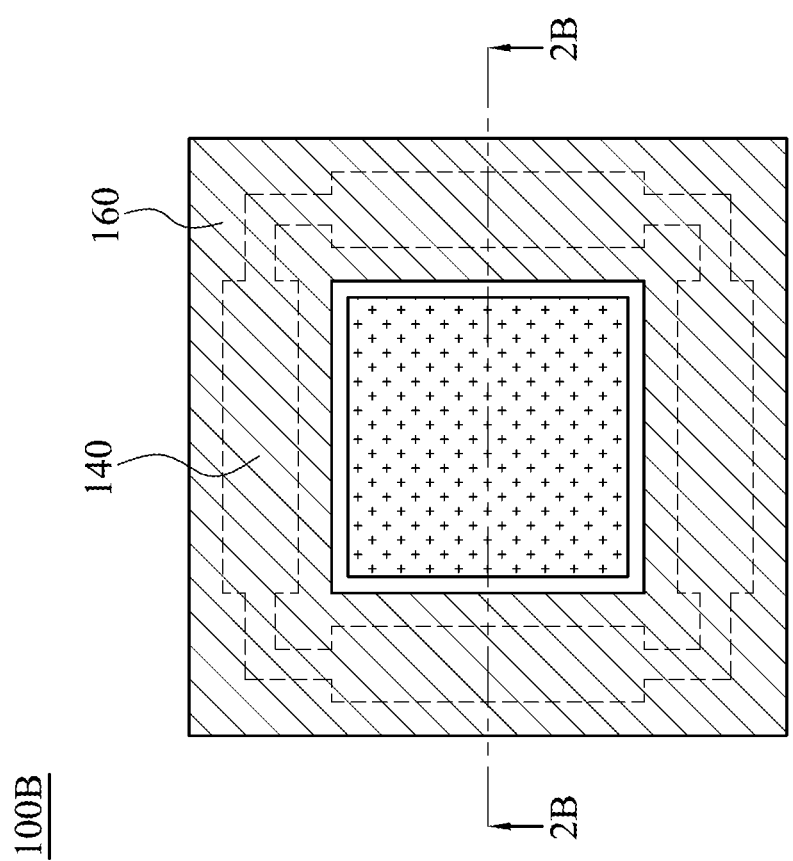
Fig. 2A
Fig. 2B

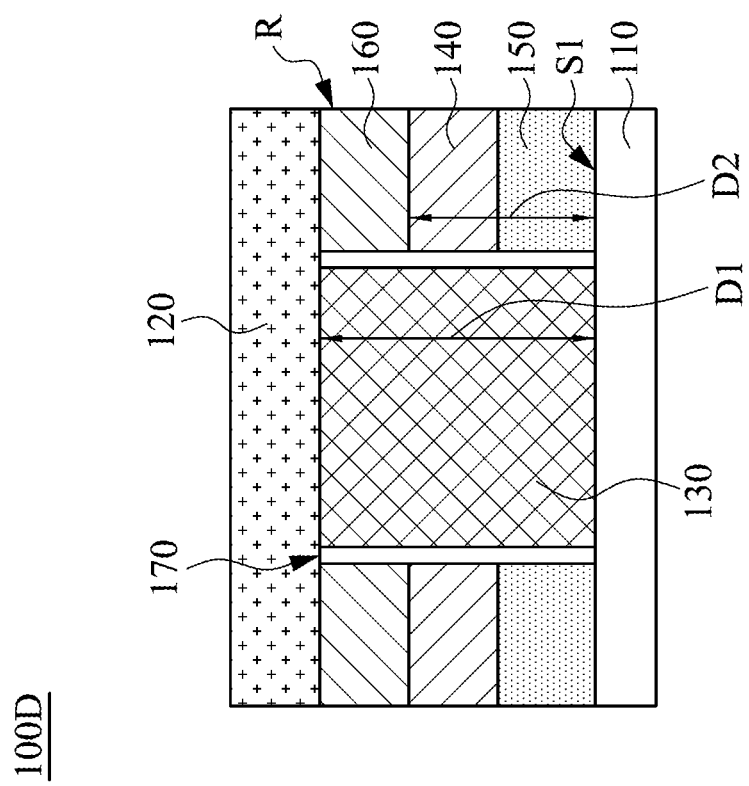
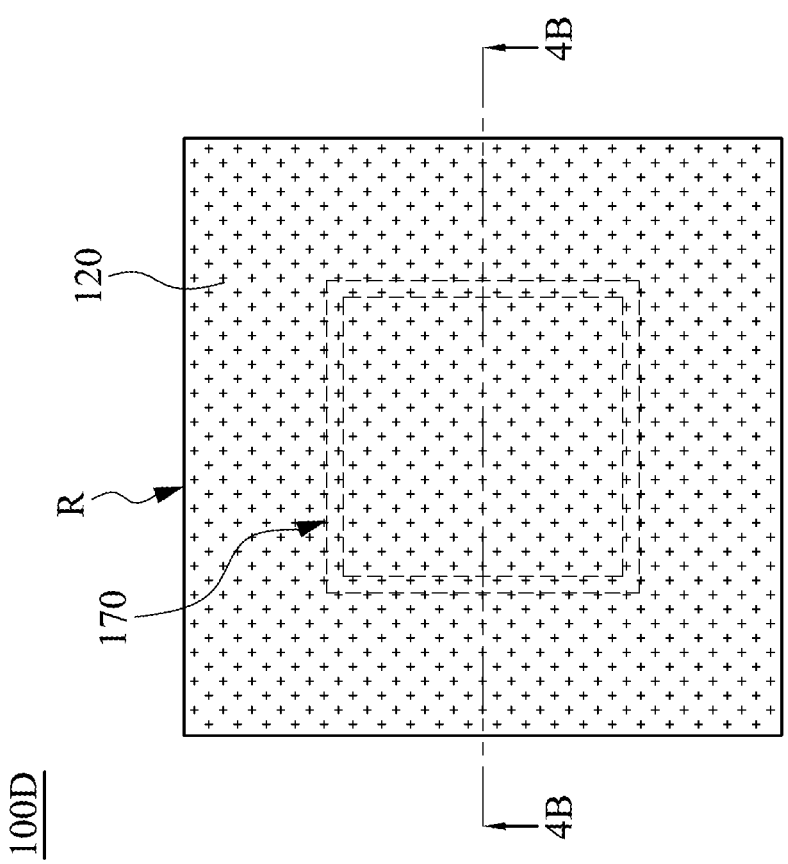
Fig. 4B
Fig. 4A

HEATING-COOLING MODULE

RELATED APPLICATIONS

This application claims priority to Taiwanese Application Serial Number 107131756, filed Sep. 10, 2018, which is herein incorporated by reference.

BACKGROUND

Technical Field

The present disclosure relates to a heating-cooling module.

Description of Related Art

In the market of consumer electronic products, since portable devices and wearable devices are convenient for users to carry and use, the portable devices and the wearable devices have become increasingly important mainstream products in the market. Accordingly, many consumer electronic products are designed to be thinner and smaller in size. However, in addition to designing electronic products to be thinner and smaller, it is also important to consider whether the design for the electronic products would make the components arranged inside the electronic products incompatible with operating conditions. Therefore, how to make the components inside the electronic products compatible the operating conditions when the electronic products are designed to be thinner and smaller has become one of the research-and-development topics.

SUMMARY

An aspect of the present disclosure is to provide a heating-cooling module disposed on an electronic component, and the heating-cooling module includes a heat-dissipation element, a first thermal conductive layer, a heater, and a second thermal conductive layer. The heat-dissipation element is arranged over the electronic component. The first thermal conductive layer is arranged between the electronic component and the heat-dissipation element. The heater is arranged over the electronic component, in which the heater and the heat-dissipation element are located above the same side of the electronic component, and the heater and the heat-dissipation element are separated from each other. The second thermal conductive layer is arranged between the electronic component and the heater, and is separated from the first thermal conductive layer.

In some embodiments, the electronic component has a first top surface facing the heat-dissipation element and the heater, and the first and second thermal conductive layers are in contact with the first top surface.

In some embodiments, the heat-dissipation element has a second top surface, and the heater has a third top surface. The heating-cooling module further includes a heat isolation layer arranged on the heater and in contact with the third top surface. The heat isolation layer has a fourth top surface, and a distance from the second top surface of the heat-dissipation element to the first top surface of the electronic component is equal to a distance from the fourth top surface of the heat isolation layer to the first top surface of the electronic component.

In some embodiments, the heating-cooling module further includes a heat isolation layer arranged on the heater. The heat-dissipation element extends upward from the first thermal conductive layer to a position higher than the heat isolation layer and contacts the heat isolation layer, so as to sandwich the second thermal conductive, the heater, and the heat isolation layer between the heat-dissipation element and the first top surface.

In some embodiments, the heating-cooling module further includes a heat isolation layer arranged on the heater. The heat-dissipation element is plate-shaped, and has a bottom surface facing the first thermal conductive layer and the heat isolation layer, and the bottom surface is in contact with the first thermal conductive layer and the heat isolation layer.

In some embodiments, the heating-cooling module further includes a heat isolation layer arranged on the heater. The first thermal conductive layer is surrounded by the second thermal conductive layer and the heat isolation layer. The first thermal conductive layer, the second thermal conductive layer, and the heat isolation layer are collectively sandwiched between the heat-dissipation element and the first top surface, and at least one gap is present between the heat-dissipation element and the first top surface.

In some embodiments, the heating-cooling module further includes a heat isolation layer arranged on the heater. A ring-shaped structure is formed by the heat isolation layer and the second thermal conductive layer collectively, and the first thermal conductive layer and the heat-dissipation element are located within the ring-shaped structure.

In some embodiments, the ring-shaped structure is separated from the first thermal conductive layer and the heat-dissipation element by at least one gap.

In some embodiments, the heating-cooling module further includes a heat isolation layer arranged on the heater. A ring-shaped structure is formed by the heat isolation layer and the second thermal conductive layer collectively, and the first thermal conductive layer and the ring-shaped structure are collectively sandwiched between the heat-dissipation element and the electronic component.

In some embodiments, the heating-cooling module further includes a heat isolation layer arranged over the second thermal conductive layer, so as to sandwich the heater between the heat isolation layer and the second thermal conductive layer.

In some embodiments, the first thermal conductive layer and the second thermal conductive layer are separated from each other by at least one gap, and the at least one gap forms at least one interface with the first thermal conductive layer, the second thermal conductive layer, and the heat-dissipation element.

In some embodiments, the heating-cooling module further includes a gas-phase isolation material filling the gap.

In some embodiments, a ring-shaped structure is formed by the first thermal conductive layer and the heat-dissipation element collectively, and the heater and the second thermal conductive layer are located within the ring-shaped structure.

BRIEF DESCRIPTION OF THE DRAWINGS

FIG. 1A is a schematic top view of a heating-cooling module according to a first embodiment of the present disclosure;

FIG. 1B is a cross-sectional view taken along line 1B-1B of FIG. 1A;

FIG. 2A is a schematic top view of a heating-cooling module according to a second embodiment of the present disclosure;

FIG. 2B is a cross-sectional view taken along line 2B-2B of FIG. 2A;

FIG. 4A is a schematic top view of a heating-cooling module according to a fourth embodiment of the present disclosure;

FIG. 4B is a cross-sectional view taken along line 4B-4B of FIG. 4A;

DETAILED DESCRIPTION

Figure 3B:
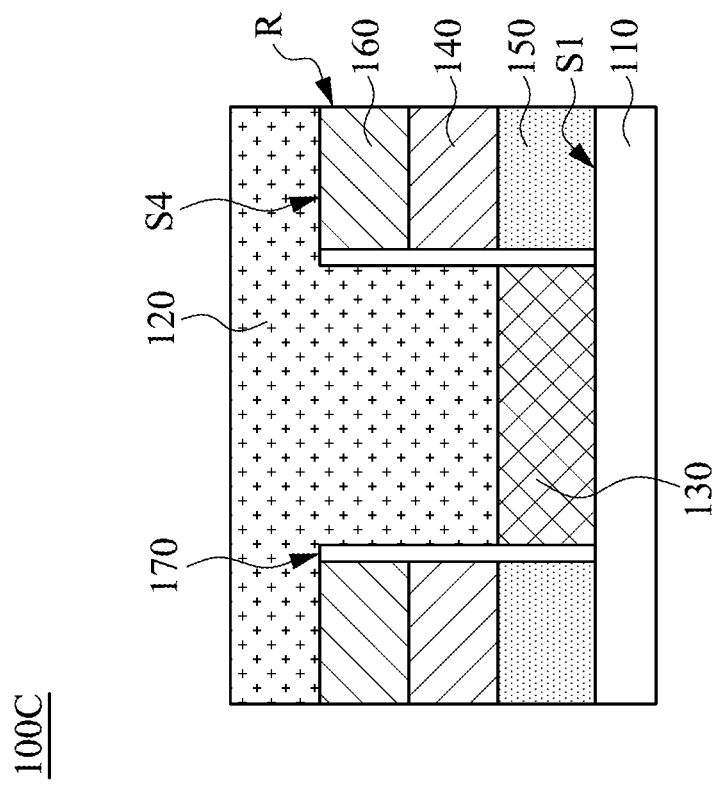
FIG. 3B is a cross-sectional view taken along line 3B-3B of FIG. 3A.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It will be understood that, although the terms first, second, third etc. may be used herein to describe various elements, components, regions, layers and/or sections, these elements, components, regions, layers and/or sections should not be limited by these terms. Further, the term "substantially" in the present disclosure refers to the fact that embodiments having any tiny variation or modification not affecting the essence of the technical features can be included in the scope of the present disclosure. For example, the term "substantially" means a stated value with a standard deviation, such as being in a range of ±20%, ±10%, or ±5%.

Reference is made to FIGS. 1A and 1B. FIG. 1A is a schematic top view of a heating-cooling module 100A according to a first embodiment of the present disclosure. FIG. 1B is a cross-sectional view taken along line 1B-1B of FIG. 1A. A heating-cooling module 100A is disposed on an electronic component 110. The heating-cooling module 100A includes a heat-dissipation element 120, a first thermal conductive layer 130, a heater 140, a second thermal conductive layer 150, and a heat isolation layer 160. The electronic component 110 may be a battery, a processor, or a component which may generate heat during its operating period, and the electronic component 110 has a first top surface S1.

The heat-dissipation element 120 is arranged over the first top surface S1 of the electronic component 110, and the first thermal conductive layer 130 is arranged between the electronic component 110 and the heat-dissipation element 120. The first thermal conductive layer 130 is in contact with the first top surface S1 of the electronic component 110 and a bottom surface of the heat-dissipation element 120, in which the bottom surface of the heat-dissipation element 120 faces the electronic component 110.

The heat-dissipation element 120 can perform heat exchange with the electronic component 110 through the first thermal conductive layer 130. For example, when the electronic component 110 is in operation and generates heat to cause a temperature increase, the heat generated by the electronic component 110 can be transferred to the heat-dissipation element 120 through the first thermal conductive layer 130, as indicated by an arrow A1. The heat-dissipation element 120 then can transfer the heat to ambient environment through a second top surface S2 thereof, in which the second top surface S2 of the heat-dissipation element 120 faces away from the electronic component 110. That is, the second top surface S2 of the heat-dissipation element 120 is located above a side of the heat-dissipation element 120 away from the electronic component 110.

The heat-dissipation element 120 may have a coefficient of thermal conductivity greater than a coefficient of thermal conductivity of the first thermal conductive layer 130. In some embodiments, the heat-dissipation element 120 may include a metal material, such as copper, iron, aluminum, magnesium, zinc, other alloys, or combinations thereof. In other embodiments, the heat-dissipation element 120 may include a non-metal material, such as acrylonitrile butadiene styrene (ABS), polymethyl methacrylate (PMMA), polycarbonate (PC), polylactic acid (PLA), other plastic materials, or combinations thereof. Furthermore, the heat-dissipation element 120 can be designed as a form similar to a finned heat sink. The first thermal conductive layer 130 may be a thermal interface material (TIM), such as thermal glue, thermal sealant, thermal paste, thermal tape, or other likes. In some embodiments, the first thermal conductive layer 130 may include a silicon-containing substance or a non-silicon-containing substance, such as thermal pad, thermal gap filler, phase change material, thermal tape, thermal grease, or thermal gel.

The first thermal conductive layer 130 can be configured to reduce a thermal resistance between the heat-dissipation element 120 and the electronic component 110, so as to enhance efficiency of the heat exchange between the heat-dissipation element 120 and the electronic component 110. Furthermore, in a situation where the first thermal conductive layer 130 is the glue and is adhesive, the heat-dissipation element 120 can be fixed above the electronic component 110 by the first thermal conductive layer 130.

The heater 140 is arranged over the electronic component 110, in which the heat-dissipation element 120 and the heater 140 are located above the same side of the electronic component 110. For example, both the heater 140 and the heat-dissipation element 120 illustrated in FIG. 1B are located above the upper side of the electronic component 110. That is, the first top surface S1 of the electronic component 110 faces the heater 140 and the heat-dissipation element 120, and both the heater 140 and the heat-dissipation element 120 are located above the first top surface S1 of the electronic component 110. Furthermore, the heat-dissipation element 120 and the heater 140 are separated from each other. In other words, a gap 170 is present between the heat-dissipation element 120 and the heater 140, such that the heat-dissipation element 120 does not contact the heater 140. The second thermal conductive layer 150 is arranged between the electronic component 110 and the heater 140 and is in contact with the first top surface S1 of the electronic component 110 and a bottom surface of the heater 140, in which the bottom surface of the heater 140 faces the electronic component 110.

The heat isolation layer 160 is arranged on the heater 140 and in contact with the third top surface S3 of the heater 140, in which the third top surface S3 of the heater 140 faces away from the electronic component 110 (i.e., the third top surface S3 of the heater 140 is located at a side of the heater 140 away from the electronic component 110). The second thermal conductive layer 150 can be separated from the heat isolation layer 160 by the heater 140. The second thermal conductive layer 150, the heater 140, and the heat isolation layer 160 have substantially the same area viewed in the top plan view (e.g. as shown in FIG. 1A).

The heater 140 can perform heat exchange with the electronic component 110 through the second thermal conductive layer 150. For example, when the temperature of the electronic component 110 is desired to be increased for making the electronic component 110 meet its operating conditions, the heater 140 can transfer heat to the electronic component 110 through the second thermal conductive layer 150, so as to increase the temperature of the electronic component 110, as indicated by an arrow A2. Furthermore, in a situation where the heat is transferred from the heater 140 to the electronic component 110 through the second thermal conductive layer 150, the heat isolation layer 160 can prevent the heat generated by the heater 140 from dissipating to ambient environment, thereby enhancing the heating effect provided by the heater 140 to the electronic component 110.

On the other hand, the heat isolation layer 160 can be used for buffering a difference in height. For example, there is a difference in height between the second top surface S2 of the heat-dissipation element 120 and the third top surface S3 of the heater 140, and thus a distance from the first top surface S1 to the second top surface S2 is greater than a distance from the first top surface S1 to the third top surface S3. By arranging the heat isolation layer 160 on the heater 140 and in contact with the third top surface S3, the heat isolation layer 160 can buffer this difference in height, such that the sum of heights of the first thermal conductive layer 130 and the heat-dissipation element 120 is substantially the same as the sum of heights of the second thermal conductive layer 150, the heater 140, and the heat isolation layer 160. In other words, the second top surface S2 of the heat-dissipation element 120 and a fourth top surface S4 of the heat isolation layer 160 are substantially coplanar (i.e., being located at the same level), and a distance from the second top surface S2 of the heat-dissipation element 120 to the first top surface S1 of the electronic component 110 is substantially the same as a distance from the fourth top surface S4 of the heat isolation layer 160 to the first top surface S1 of the electronic component 110, so as to be advantageous for stacking other components on the heating-cooling module 100A. The fourth top surface S4 of the heat isolation layer 160 faces away from the electronic component 110 (i.e., fourth top surface S4 of the heat isolation layer 160 is located at a side of the heat isolation layer 160 away from the electronic component 110).

In some embodiments, the heater 140 may be an electric heating film or an electric heating element, such as a positive temperature coefficient (PTC) heating sheet, a mica heating sheet, a ceramic heating sheet, a transparent electric heating sheet, a flexible ultra-thin electric heating sheet, or the like. The second thermal conductive layer 150 may be a thermal interface material (TIM) and thus may have a property the same as or similar to that of the first thermal conductive layer 130, and the detail is not described herein. In some embodiments, the heat isolation layer 160 may include a material with a coefficient of thermal conductivity less than 0.2 W/(m·K), such as sponge, poron, rubber, polyurethane, polyethylene, Styrofoam, foamed plastics, glass wool, or the like.

Further, a ring-shaped structure R may be formed on the first top surface S1 of the electronic component 110 by the second thermal conductive layer 150, the heater 140, and the heat isolation layer 160 collectively, as shown in FIG. 1A. The ring-shaped structure R may surround and enclose the first thermal conductive layer 130 and the heat-dissipation element 120, and thus the first thermal conductive layer 130 and the heat-dissipation element 120 are located within the ring-shaped structure R. In the present embodiment, the ring-shaped structure R entirely surrounds around the first thermal conductive layer 130 and the heat-dissipation element 120. More specifically, the second thermal conductive layer 150 may have a first sidewall SW1 and a second sidewall SW2 which face different directions. For example, the first sidewall SW1 faces the right side of FIG. 1B and the second sidewall SW2 faces the left side of FIG. 1B, and both the first sidewall SW1 and the second sidewall SW2 face the first thermal conductive layer 130. In addition, although the ring-shaped structure R illustrated in FIG. 1A is rectangular, the shape of the ring-shaped structure R of the present disclosure is not limited thereto. In other embodiments, the ring-shaped structure R may be in other shape, such as circle, ellipse, triangle, or other polygons.

The first thermal conductive layer 130 and the heat-dissipation element 120 located within the ring-shaped structure R can be separated from the ring-shaped structure R by at least one gap 170, in which this gap 170 may be an air gap formed by filling a gas-phase isolation material into the gap 170. In this regard, since the gap 170 is located around the first thermal conductive layer 130 and the heat-dissipation element 120, thermal resistances between the first thermal conductive layer 130 and the ring-shaped structure R and between the heat-dissipation element 120 and the ring-shaped structure R can be increased by the gap 170. Moreover, the first thermal conductive layer 130 can be separated from the second thermal conductive layer 150 by the gap 170, and the heat-dissipation element 120 can be separated from the heater 140 and the heat isolation layer 160 by the gap 170. The gap 170 can form at least one interface with the first thermal conductive layer 130, the heat-dissipation element 120, and the second thermal conductive layer 150, thereby preventing a heat dissipation path from the electronic component 110 to the heat-dissipation element 120 and a heating path from the heater 140 to the electronic component 110 from affecting each other.

By the above configuration, under the condition of preventing the heat dissipation path and the heating path from affecting each other, the heat-dissipation element 120, the heater 140, and the thermal conductive layers can be collectively integrated on the same side of the electronic component 110. For example, the heat-dissipation element 120, the heater 140, and the thermal conductive layers are collectively integrated on the first top surface S1 of the electronic component 110, so as to increase a space usage rate of the heating-cooling module 100A. Further, under the condition of arranging the heat-dissipation element 120, the heater 140, and the thermal conductive layers on the same side of the electronic component 110 collectively, the heating-cooling module 100A is advantageous to a design of thinness and smallness. In addition, although the thermal resistances between the first thermal conductive layer 130 and the ring-shaped structure R and between the heat-dissipation element 120 and the ring-shaped structure R are increased by the gap 170, the way to increase thermal resistance in the present embodiment is not limited thereto. In other embodiments, a dielectric material having a low coefficient of thermal conductivity may be used for replacing the gap 170 to increase thermal resistance as well. For example, a solid dielectric material can fill between the first thermal conductive layer 130 and the ring-shaped structure R and between the heat-dissipation element 120 and the ring-shaped structure R, so as to correspondingly increase thermal resistances.

Reference is made to FIGS. 2A and 2B. FIG. 2A is a schematic top view of a heating-cooling module 100B according to a second embodiment of the present disclosure. FIG. 2B is a cross-sectional view taken along line 2B-2B of FIG. 2A. At least one difference between the present embodiment and the first embodiment is that the heater 140 of the present embodiment has an area viewed in top plan (e.g., as viewed in FIG. 2A) less than areas of the second thermal conductive layer 150 and the heat isolation layer 160 viewed in the top plan view (e.g., as shown in FIG. 2A). By such configuration, the heater 140 can be embedded between the heat isolation layer 160 and the second thermal conductive layer 150 to prevent the heater 140 from falling from between the heat isolation layer 160 and the second thermal conductive layer 150, thereby advantageously enhancing structural strength of the heating-cooling module 100B. Moreover, such configuration can further enhance a heating effect form the heater 140 to the electronic component 110, so as to prevent the heat provided by the heater 140 from dissipating to ambient environment. Although no wire is illustrated in FIGS. 2A and 2B, the heater 140 can be connected to an external circuit though at least one wire.

Figure 3A:
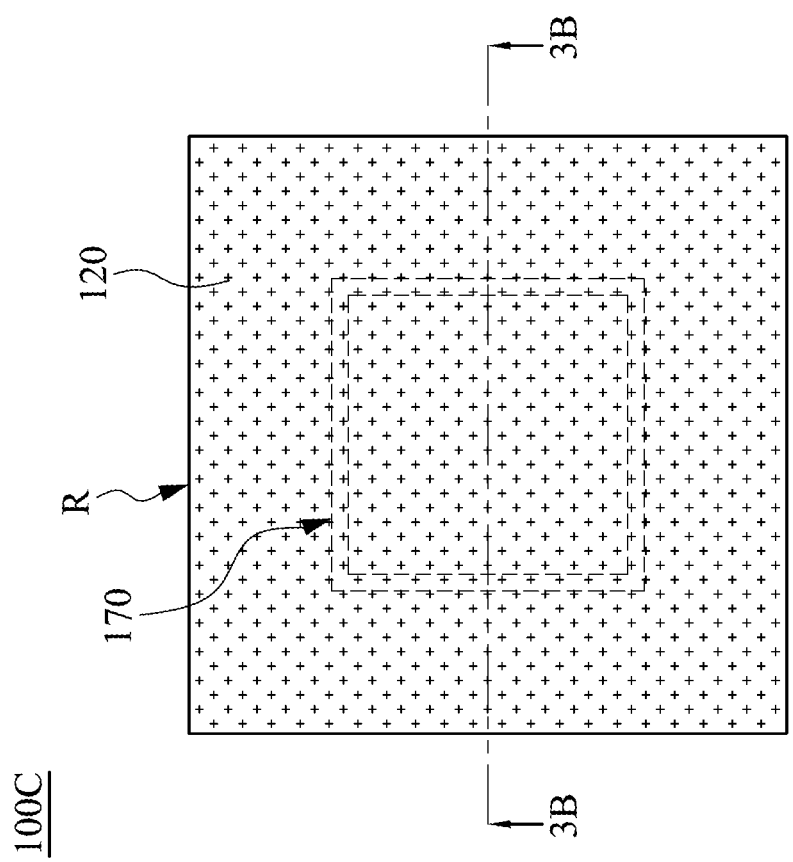
FIG. 3A is a schematic top view of a heating-cooling module according to a third embodiment of the present disclosure.

Reference is made to FIGS. 3A and 3B. FIG. 3A is a schematic top view of a heating-cooling module 100C according to a third embodiment of the present disclosure. FIG. 3B is a cross-sectional view taken along line 3B-3B of FIG. 3A. At least one difference between the present embodiment and the first embodiment is that the heat-dissipation element 120 of the present embodiment extends from inside of the ring-shaped structure R to outside of the ring-shaped structure R.

Specifically, when the selected first thermal conductive layer 130 has a thickness less than the sum of thicknesses of the second thermal conductive layer 150 and the heat isolation layer 160, the heat-dissipation element 120 can be arranged to extend upward from the first thermal conductive layer 130 to a position higher than the fourth top surface S4 of the heat isolation layer 160, and to contact the fourth top surface S4 of the heat isolation layer 160, and the first thermal conductive layer 130, the second thermal conductive layer 150, the heater 140, and the heat isolation layer 160 are sandwiched between the heat-dissipation element 120 and the first top surface S1 of the electronic component 110. Moreover, the heat-dissipation element 120 and the first top surface S1 of the electronic component 110 are respectively located above and below the gap 170, and the gap 170 is covered by the heat-dissipation element 120. Similarly, the gap 170 may prevent the heat dissipation path from the electronic component 110 to the heat-dissipation element 120 and the heating path from the heater 140 to the electronic component 110 from affecting each other. In addition, the heat isolation layer 160 is advantageous to prevent the heat provided by the heater 140 from transferring to the heat-dissipation element 120.

On the other hand, by sandwiching the first thermal conductive layer 130, the second thermal conductive layer 150, the heater 140, and the heat isolation layer 160 between the heat-dissipation element 120 and the first top surface S1 of the electronic component 110, it can prevent the first thermal conductive layer 130, the second thermal conductive layer 150, the heater 140, and the heat isolation layer 160 from falling from between the heat-dissipation element 120 and the electronic component 110, thereby advantageously enhancing structural strength of the heating-cooling module 100C.

Reference is made to FIGS. 4A and 4B. FIG. 4A is a schematic top view of a heating-cooling module 100D according to a fourth embodiment of the present disclosure. FIG. 4B is a cross-sectional view taken along line 4B-4B of FIG. 4A. At least one difference between the present embodiment and the first embodiment is that the heat-dissipation element 120 of the present embodiment is a plate-shaped structure and covers the ring-shaped structure R collectively formed by the second thermal conductive layer 150, the heater 140, and the heat isolation layer 160, in which the bottom surface of the heat-dissipation element 120 faces the heat isolation layer 160 and is in contact with the fourth top surface S4 of the heat isolation layer 160, such that the ring-shaped structure R is sandwiched between the heat-dissipation element 120 and the electronic component 110.

On the other hand, the first thermal conductive layer 130 has a thickness that is correspondingly increasing and extends from the first top surface S1 of the electronic component 110 to the heat-dissipation element 120 so as to contact the bottom surface of the heat-dissipation element 120, thereby maintaining a heat transfer path from the electronic component 110 to the heat-dissipation element 120. Specifically, a distance from an interface between the heat-dissipation element 120 and the first thermal conductive layer 130 to the first top surface S1 of the electronic component 110 is labeled as a first distance D1, and a distance from an interface between the heat isolation layer 160 and the heater 140 to the first top surface S1 of the electronic component 110 is labeled as a second distance D2, where the first distance D1 is greater than the second distance D2. A distance from the fourth top surface S4 of the heat isolation layer 160 to the first top surface S1 of the electronic component 110 is substantially the same as the first distance D1. Furthermore, in the present embodiment, the gap 170 is present between the first thermal conductive layer 130 and the ring-shaped structure R and between the heat-dissipation element 120 and the first top surface S1 of the electronic component 110, and the gap 170 is covered by the heat-dissipation element 120. In the present embodiment, by designing the heat-dissipation element 120 as the plate-shaped structure, it can be advantageous to conveniently assemble the heating-cooling module 100D.

Figure 5:
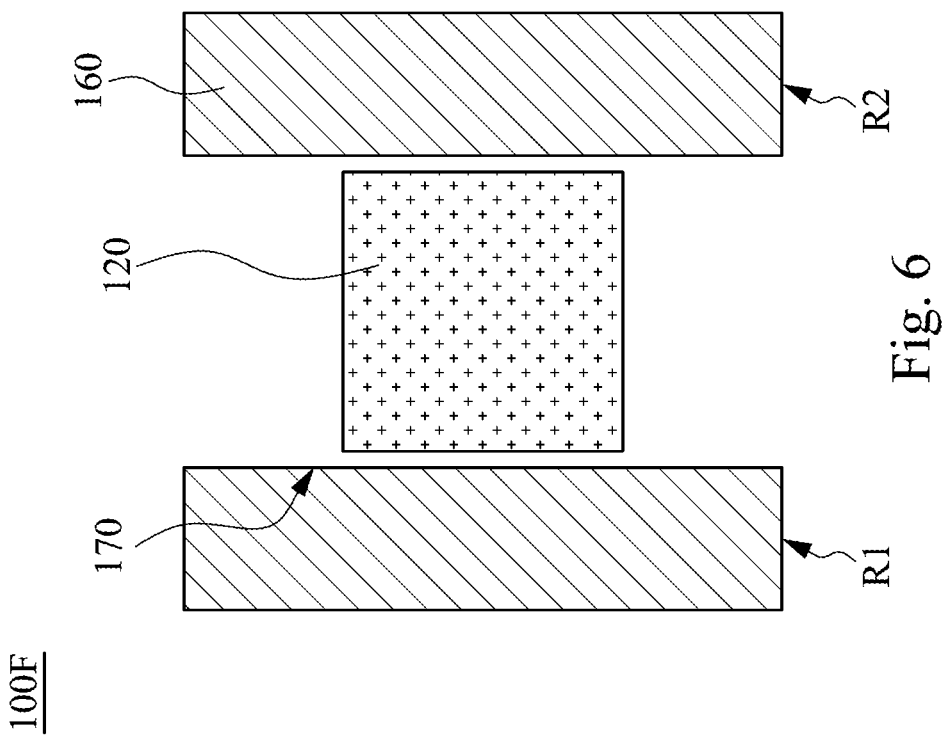
FIG. 5 is a schematic top view of a heating-cooling module according to a fifth embodiment of the present disclosure.

Reference is made to FIG. 5 which is a schematic top view of a heating-cooling module 100E according to a fifth embodiment of the present disclosure. At least one difference between the present embodiment and the first embodiment is that the ring-shaped structure R of the present embodiment partially surrounds around the first thermal conductive layer (e.g., the first thermal conductive layer 130 illustrated in FIG. 1B) and the heat-dissipation element 120. That is, the ring-shaped structure R may have an opening 180. Specifically, the ring-shaped structure R illustrated in FIG. 5 is in a C-shape. However, the ring-shaped structure R of the present disclosure is not limited thereto. In other embodiments, the ring-shaped structure R having the opening 180 may be in another shape. In addition, the heat-dissipation element 120 is still separated from the ring-shaped structure R having the opening 180 by the gap 170.

Figure 6:
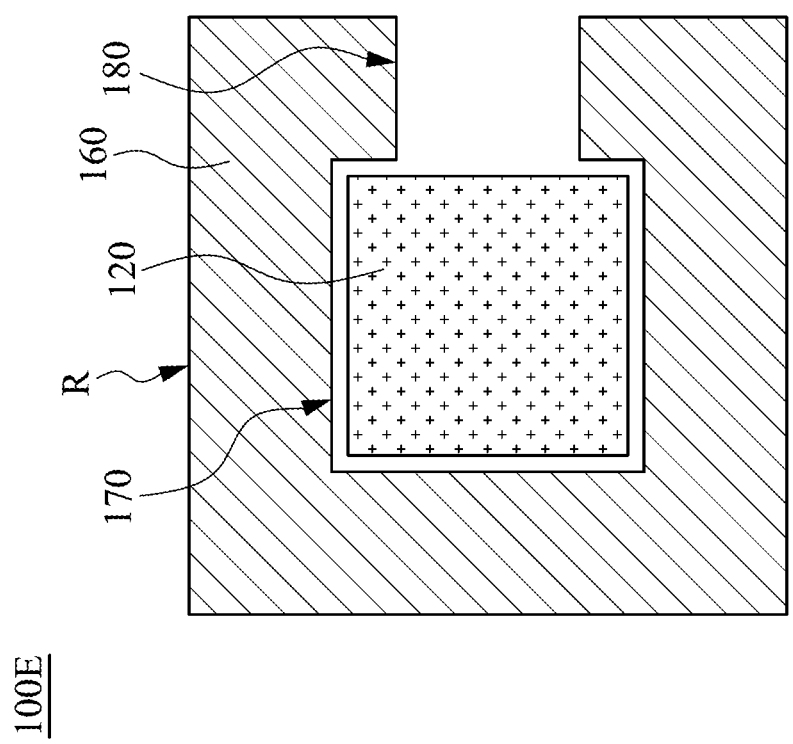
FIG. 6 is a schematic top view of a heating-cooling module according to a sixth embodiment of the present disclosure.

Reference is made to FIG. 6 which is a schematic top view of a heating-cooling module 100F according to a sixth embodiment of the present disclosure. At least one difference between the present embodiment and the first embodiment is that the ring-shaped structure R of the present embodiment is formed by modifying the ring-shaped structure R of the first embodiment into a multi-segments structure. For example, as shown in FIG. 6, a heating structure formed by the second thermal conductive layer (e.g., the second thermal conductive layer 150 illustrated in FIG. 1B), the heater (e.g., the heater 140 illustrated in FIG. 1B), and the heat isolation layer 160 can be divided into a first segment R1 and a second segment R2, and the heat-dissipation element 120 and the first thermal conductive layer (e.g., the first thermal conductive layer 130 illustrated in FIG. 1B) that is below the heat-dissipation element 120 are located between the first segment R1 and the second segment R2. In addition, the heat-dissipation element 120 is still separated from the first segment R1 and the second segment R2 by the gap 170.

Figure 7B:
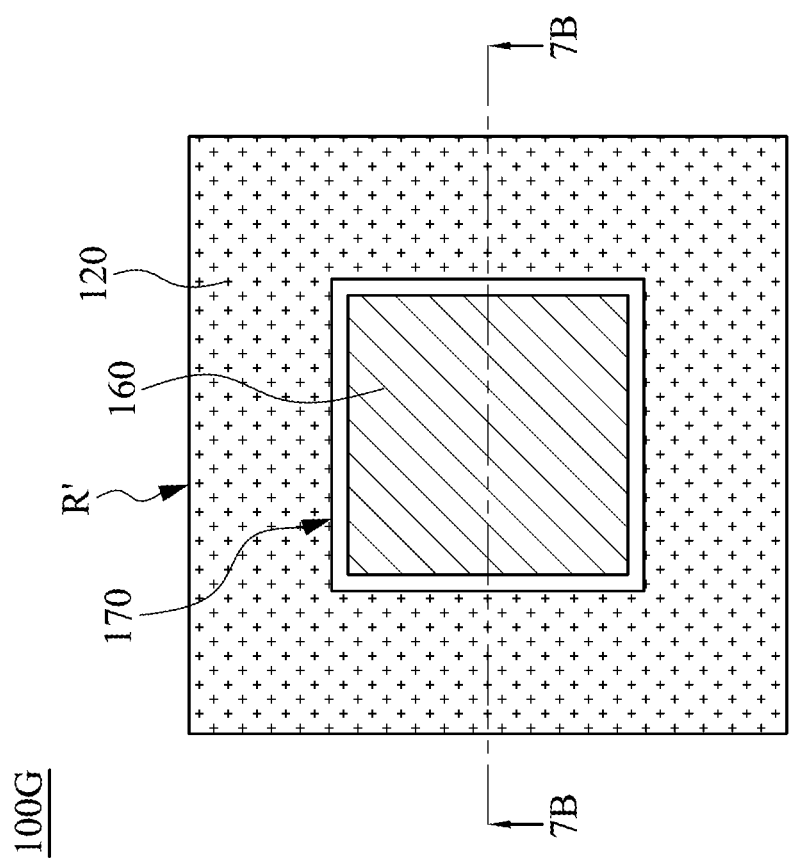
FIG. 7B is a cross-sectional view taken along line 7B-7B of FIG. 7A.
Figure 7A:
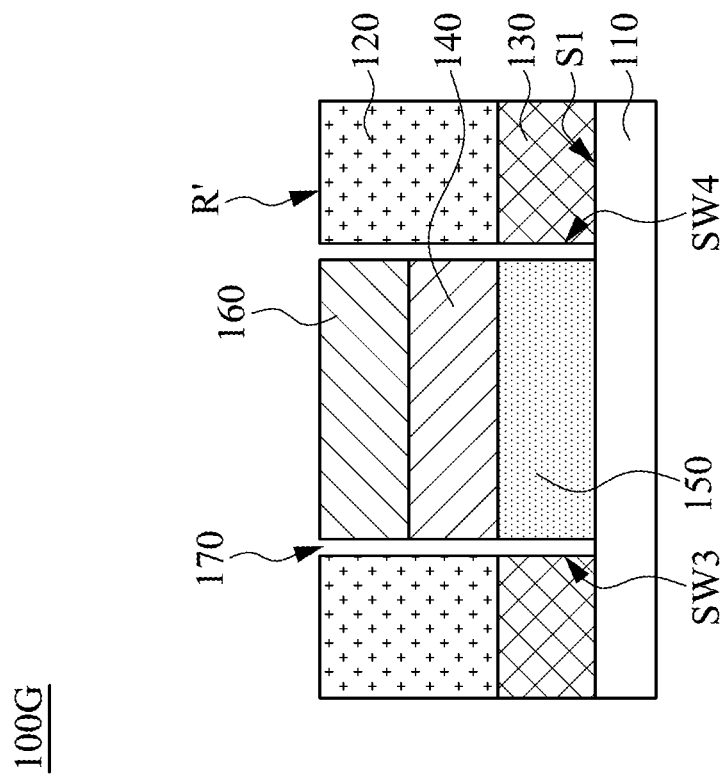
FIG. 7A is a schematic top view of a heating-cooling module according to a seventh embodiment of the present disclosure.

Reference is made to FIGS. 7A and 7B. FIG. 7A is a schematic top view of a heating-cooling module 100G according to a seventh embodiment of the present disclosure. FIG. 7B is a cross-sectional view taken along line 7B-7B of FIG. 7A. At least one difference between the present embodiment and the first embodiment is that the arranged heat dissipation path and the heating structure are interchanged in position.

Specifically, in the present embodiment, a ring-shaped structure R' is formed by the heat-dissipation element 120 and the first thermal conductive layer 130 collectively, and the heater 140, the second thermal conductive layer 150, and the heat isolation layer 160 are surrounded around by the ring-shaped structure R'. The first thermal conductive layer 130 may have a third sidewall SW3 and a fourth sidewall SW4 which face different directions. For example, the third sidewall SW3 faces the right side of FIG. 7B, the fourth sidewall SW4 faces the left side of FIG. 7B, and both the third sidewall SW3 and the fourth sidewall SW4 face the second thermal conductive layer 150. In addition, the ring-shaped structure R' collectively formed by the heat-dissipation element 120 and the first thermal conductive layer 130 is still separated from the heater 140, the second thermal conductive layer 150, and the heat isolation layer 160 by the gap 170, and the heat-dissipation element 120, the first thermal conductive layer 130, the heater 140, the second thermal conductive layer 150, and the heat isolation layer 160 are located above the same side of the first top surface S1 of the electronic component 110.

As described above, the heating-cooling module of the present disclosure is disposed on the electronic component and includes the heat-dissipation element, the first thermal conductive layer, the heater, and the second thermal conductive layer. The heat-dissipation element and the heater are arranged above the same side of the electronic component and are separated from each other. The first thermal conductive layer is arranged between the electronic component and the heat-dissipation element. The second thermal conductive layer is arranged between electronic component and the heater and is separated from the first thermal conductive layer. By such configuration, the heat dissipation path from the electronic component to the heat-dissipation element and the heating path from the heater to the electronic component are integrated on the same side of the electronic component, thereby increasing the space usage rate of the heating-cooling module. In addition, the heat dissipation path from the electronic component to the heat-dissipation element and the heating path from the heater to the electronic component can be separated from each other by the gap, thereby preventing the heat dissipation path and heating path from affecting each other.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A heating-cooling module disposed on an electronic component, the heating-cooling module comprising:
    a heat-dissipation element arranged over the electronic component;
    a first thermal conductive layer arranged between the electronic component and the heat-dissipation element;
    a heater arranged over the electronic component, wherein the heater and the heat-dissipation element are located above the same side of the electronic component, and the heater and the heat-dissipation element are separated from each other; and
    a second thermal conductive layer arranged between the electronic component and the heater and separated from the first thermal conductive layer.

2. The heating-cooling module of claim 1, wherein the electronic component has a first top surface facing the heat-dissipation element and the heater, and the first and second thermal conductive layers are in contact with the first top surface.

3. The heating-cooling module of claim 2, wherein the heat-dissipation element has a second top surface, the heater has a third top surface, the heating-cooling module further comprises a heat isolation layer that is arranged on the heater and is in contact with the third top surface, wherein the heat isolation layer has a fourth top surface, and a distance from the second top surface of the heat-dissipation element to the first top surface of the electronic component is equal to a distance from the fourth top surface of the heat isolation layer to the first top surface of the electronic component.

4. The heating-cooling module of claim 2, further comprising:
    a heat isolation layer arranged on the heater, wherein the heat-dissipation element extends upward from the first thermal conductive layer to a position higher than the heat isolation layer and contacts the heat isolation layer, so as to sandwich the second thermal conductive layer, the heater, and the heat isolation layer between the heat-dissipation element and the first top surface.

5. The heating-cooling module of claim 2, further comprising:
    a heat isolation layer arranged on the heater, wherein the heat-dissipation element is plate-shaped and has a bottom surface facing the first thermal conductive layer and the heat isolation layer, and the bottom surface is in contact with the first thermal conductive layer and the heat isolation layer.

6. The heating-cooling module of claim 2, further comprising:
    a heat isolation layer arranged on the heater, wherein the first thermal conductive layer is surrounded by the second thermal conductive layer and the heat isolation layer, the first thermal conductive layer, the second thermal conductive layer, and the heat isolation layer are collectively sandwiched between the heat-dissipation element and the first top surface, and at least one gap is present between the heat-dissipation element and the first top surface.

7. The heating-cooling module of claim 1, further comprising:
a heat isolation layer arranged on the heater, wherein a ring-shaped structure is formed by the heat isolation layer and the second thermal conductive layer collectively, and the first thermal conductive layer and the heat-dissipation element are located within the ring-shaped structure.

8. The heating-cooling module of claim 7, wherein the ring-shaped structure is separated from the first thermal conductive layer and the heat-dissipation element by at least one gap.

9. The heating-cooling module of claim 1, further comprising:
a heat isolation layer arranged on the heater, wherein a ring-shaped structure is formed by the heat isolation layer and the second thermal conductive layer collectively, and the first thermal conductive layer and the ring-shaped structure are collectively sandwiched between the heat-dissipation element and the electronic component.

10. The heating-cooling module of claim 1, further comprising:
a heat isolation layer arranged over the second thermal conductive layer, so as to sandwich the heater between the heat isolation layer and the second thermal conductive layer.

11. The heating-cooling module of claim 1, wherein the first thermal conductive layer and the second thermal conductive layer are separated from each other by at least one gap, and the at least one gap forms at least one interface with the first thermal conductive layer, the second thermal conductive layer, and the heat-dissipation element.

12. The heating-cooling module of claim 11, further comprising:
a gas-phase isolation material filling the gap.

13. The heating-cooling module of claim 1, wherein a ring-shaped structure is formed by the first thermal conductive layer and the heat-dissipation element collectively, and the heater and the second thermal conductive layer are located within the ring-shaped structure.

* * * * *